United States Patent
Lo

(10) Patent No.: US 8,781,045 B2
(45) Date of Patent: Jul. 15, 2014

(54) COMMUNICATION APPARATUSES AND WIRELESS COMMUNICATIONS MODULES

(75) Inventor: Chi-Yeh Lo, Gueishan Township, Taoyuan County (TW)

(73) Assignee: Mediatek Inc., Hsin-Chu (TW)

( * ) Notice: Subject to any disclaimer, the term of this patent is extended or adjusted under 35 U.S.C. 154(b) by 206 days.

(21) Appl. No.: 13/011,250

(22) Filed: Jan. 21, 2011

(65) Prior Publication Data

US 2012/0057624 A1    Mar. 8, 2012

Related U.S. Application Data

(60) Provisional application No. 61/379,497, filed on Sep. 2, 2010.

(51) Int. Cl.
| | |
|---|---|
| H04L 7/04 | (2006.01) |
| H03M 1/12 | (2006.01) |
| H04B 3/46 | (2006.01) |
| H03L 1/02 | (2006.01) |
| H03J 1/00 | (2006.01) |
| H03L 7/197 | (2006.01) |
| H03L 7/18 | (2006.01) |

(52) U.S. Cl.
CPC ............. *H03J 1/005* (2013.01); *H03L 7/1976* (2013.01); *H03L 1/02* (2013.01); *H03L 7/18* (2013.01)
USPC ........... 375/354; 375/371; 375/373; 375/376; 331/176; 455/255; 455/264; 455/256; 455/456.1; 455/456.2; 455/456.5; 455/456.6

(58) Field of Classification Search
USPC ........... 375/354–377; 331/176; 455/255, 264, 455/256, 456.1, 456.2, 456.5, 456.6, 533.1
See application file for complete search history.

(56) References Cited

U.S. PATENT DOCUMENTS

| | | | |
|---|---|---|---|
| 5,629,708 A | 5/1997 | Rodal et al. | |
| 6,041,222 A * | 3/2000 | Horton et al. | 455/255 |
| 6,522,871 B1 * | 2/2003 | Patrick et al. | 331/176 |
| 7,239,857 B2 | 7/2007 | Abraham | |
| 2006/0094465 A1 * | 5/2006 | Abraham | 455/556.1 |
| 2009/0221300 A1 * | 9/2009 | Jin | 455/456.1 |
| 2010/0017139 A1 | 1/2010 | Adams et al. | |
| 2010/0207813 A1 | 8/2010 | Lo et al. | |

FOREIGN PATENT DOCUMENTS

| | | |
|---|---|---|
| CN | 1529939 | 9/2004 |
| TW | 201031942 | 9/2010 |
| WO | WO 99/13595 | 3/1999 |

* cited by examiner

*Primary Examiner* — Shuwang Liu
*Assistant Examiner* — Ross Varndell
(74) *Attorney, Agent, or Firm* — McClure, Qualey & Rodack, LLP

(57) ABSTRACT

A communication apparatus having a first and second wireless communications modules is provided. The first wireless communications module includes a receiving unit receiving RF signals from an air interface, a signal processing module performing frequency down conversion on the RF signals to generate baseband signals according to a clock signal, and a processor processing the baseband signals. The processor further detects an ON/OFF status of the second wireless communications module to obtain a detection result and compensates for frequency drift of the clock signal according to the detection result.

12 Claims, 8 Drawing Sheets

600

610

COMMUNICATION APPARATUSES AND WIRELESS COMMUNICATIONS MODULES

CROSS REFERENCE TO RELATED APPLICATIONS

This application claims the benefit of U.S. Provisional Application No. 61/379,497 filed Sep. 2, 2010 and entitled "Detection Method and Apparatus to Overcome Variation of LO Frequency in A Wireless Communication Device". The entire contents of which are hereby incorporated by reference.

BACKGROUND OF THE INVENTION

1. Field of the Invention

The invention relates to a wireless communications module, and more particularly to a wireless communications module in a multi-radio communication apparatus which is capable of compensating for frequency drift of a clock signal due to activation of other wireless communications modules co-located in the multi-radio communication apparatus.

2. Description of the Related Art

With the development of wireless communications technology, mobile electronic devices may now be equipped with more than one wireless communications module to provide different wireless communications services, such as a GSM (Global System for Mobile Communications), a WCDMA (Wideband Code Division Multiple Access), cdma2000, a WiMAX (Worldwide Interoperability for Microwave Access), a TD-SCDMA (Time Division Synchronous Code Division Multiple Access), an LTE (Long Term Evolution), a TD-LTE (Time Division Long Term Evolution), a Bluetooth, a Wireless Fidelity (Wi-Fi), and a Global Positioning System (GPS) wireless communications service, and any combinations thereof. In this regard, in the mobile electronic devices, there is more than one clock source configured to generate a local oscillating (LO) frequency which is utilized by each wireless communications module for generating radio frequency (RF) signals to be transmitted to an air interface, and/or down converting RF signals into intermediate frequency or baseband signals for further signal processing.

However, because integrated circuits (ICs) continue to shrink in size, the placement distance between each wireless communications module has also shrunk, resulting in influence generated therebetween, such as clock frequency drift. Frequency drift is an unintended and generally arbitrary offset of an oscillator from a nominal frequency. For a radio transmitter and/or receiver, frequency drift can cause a radio station to drift to an adjacent channel, causing illegal interference. Because of this, a method for compensating for frequency drift and a communication apparatus utilizing the same is highly required.

BRIEF SUMMARY OF THE INVENTION

Communication apparatuses and wireless communications modules are provided. An embodiment of a communication apparatus comprises a first wireless communications module arranged to provide a first wireless communications service and a second wireless communications module, arranged to provide a second wireless communications service. The first wireless communications module comprises a receiving unit receiving RF signals from an air interface, a signal processing module performing frequency down conversion on the RF signals to generate baseband signals according to a clock signal, and a processor processing the baseband signals. The processor further detects an ON/OFF status of the second wireless communications module to obtain a detection result and compensates for frequency drift of the clock signal according to the detection result.

Another embodiment of a wireless communications module, arranged to provide a first wireless communications service, comprises a receiving unit arranged to receive RF signals from an air interface, a signal processing module arranged to perform frequency down conversion on the RF signals to generate baseband signals according to a clock signal, and a processor arranged to process the baseband signals. The processor further detects a thermal change rate of an environment temperature to obtain a detection result and compensates for frequency drift of the clock signal according to the detection result.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
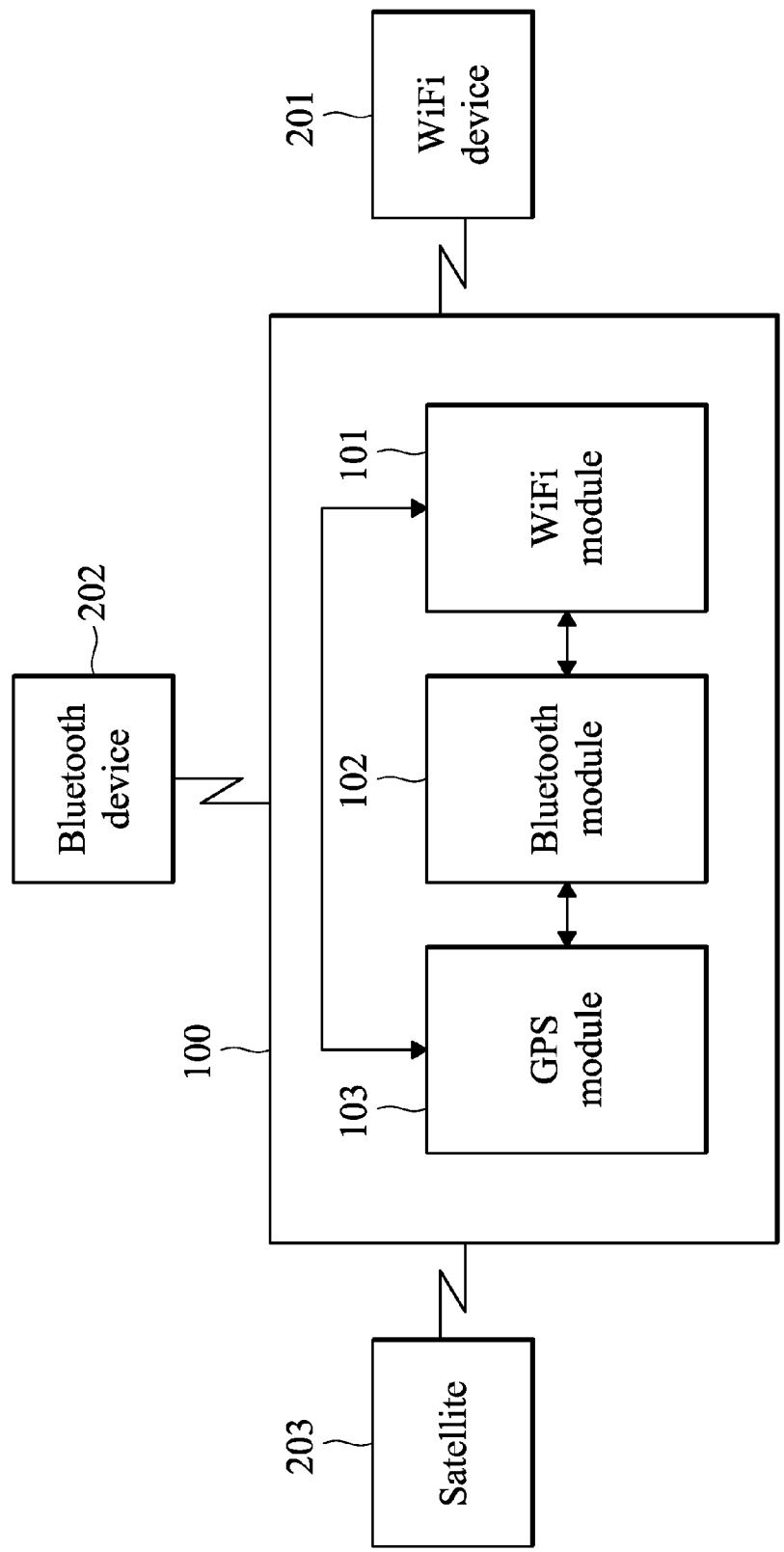
FIG. 1 shows a schematic diagram of a multi-radio communications system according to an embodiment of the invention.

Along with the advancements in wireless communications technology, radio modules, or so-called wireless communications modules, different wireless communications services may be co-located and coexist in a mobile electronic device, or so-called communications apparatus. FIG. 1 shows a schematic diagram of a multi-radio communications system according to an embodiment of the invention. The mobile electronic device 100 may be a notebook, a cellular phone, a portable gaming device, a portable multimedia player, a Global Positioning System (GPS), a receiver, or others. The mobile electronic device 100 may comprise a plurality of wireless communications modules providing different wireless communications services. As an example, the mobile electronic device 100 may comprise a WiFi module 101, a Bluetooth module 102 and a GPS module 103. The WiFi module 101 may communicate with a WiFi device 201 in compliance with the IEEE 802.11 protocol via the air interface. The WiFi module 101 and WiFi device 201 may be, as an example, a WiFi Base Station (BS), Access Point (AP) or Station (STA). The Bluetooth module 102 may communicate with a Bluetooth device 202 in compliance with the Bluetooth protocol via the air interface. The Bluetooth device 202 may be, as an example, a Bluetooth handset. The GPS module 103 may communicate with a peer device via the air interface. The peer device may be, as an example, a satellite 203. According to the embodiments of the invention, each of the wireless communications modules may individually comprise an antenna to transceive radio signals. However, one antenna may be designed to be shared and utilized by the wireless communications modules to improve area efficiency and the invention should not be limited thereto. Note that wireless communications modules integrated in the mobile electronic device 100 are not limited to the WiFi, Bluetooth or GPS modules. FIG. 1 only shows one exemplary embodiment of the invention so as to simplify the description of the invention for a clearer understanding of the concepts the invention. Any wireless communications modules that provide different wireless communications services other than the WiFi, Bluetooth or GPS services as mentioned above may also be integrated within the invention and the invention should not be limited thereto. Note also that each wireless communications module may be implemented as a single chip for providing the corresponding wireless communication services, or may be integrated into a combo chip (i.e., a system on chip (SoC)), and the invention should not be limited thereto.

Figure 2:
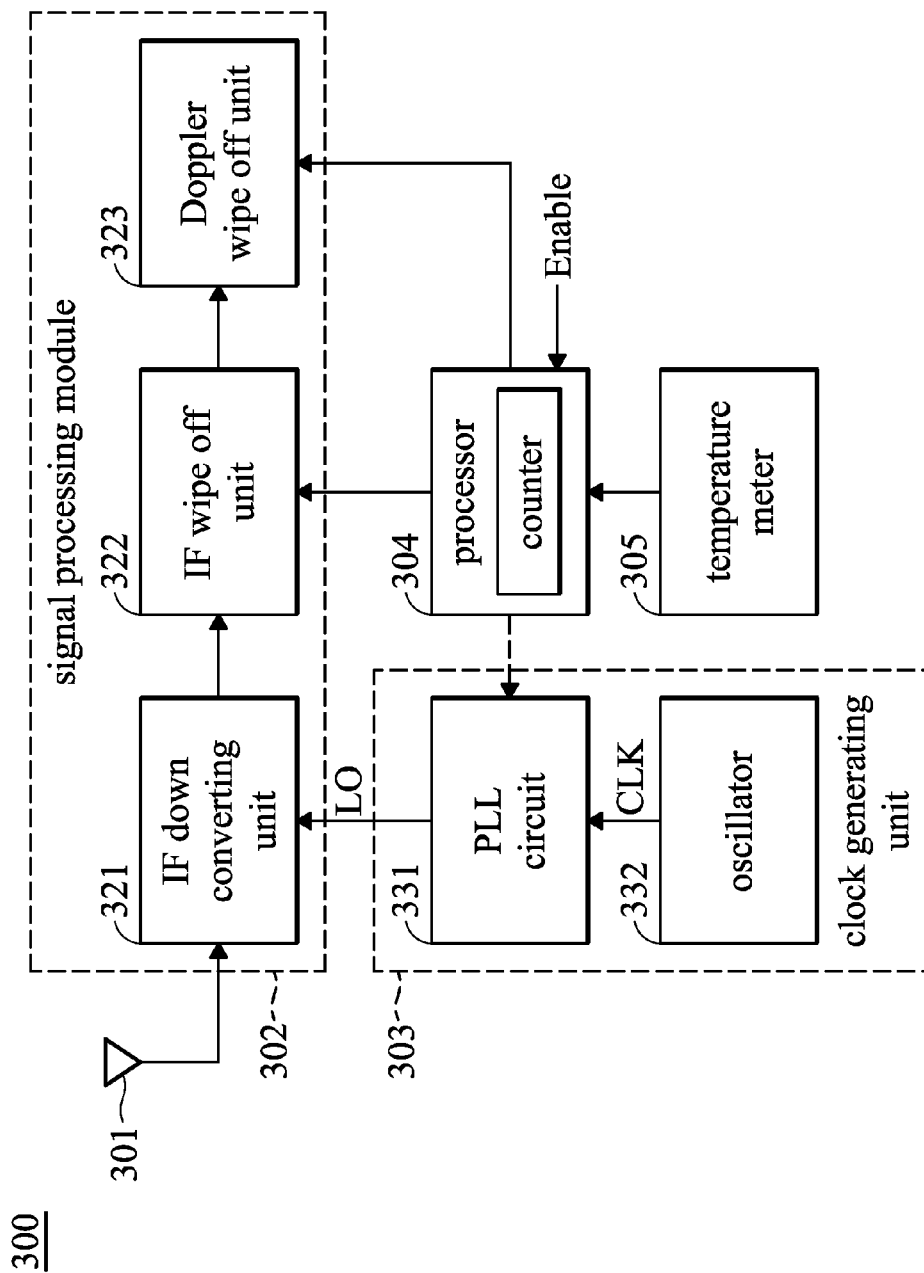
FIG. 2 shows a schematic block diagram of a wireless communications module according to an embodiment of the invention.

FIG. 2 shows a schematic block diagram of a wireless communications module according to an embodiment of the invention. The wireless communications module 300 comprises a receiving unit 301, a signal processing module 302, a clock generating unit 303 and a processor 304. In the embodiments, the receiving unit 301 may be an antenna arranged to receive RF signals from an air interface. The signal processing module 302 is arranged to perform frequency down conversion on the RF signals to generate baseband signals according to a clock signal CLK. The clock generating unit 303 comprises an oscillator 332 for generating the clock signal CLK and a phase-locked loop (PLL) circuit 331 for generating a local oscillating signal LO according to the clock signal CLK. The processor 304 is arranged to process the baseband signals.

According to an embodiment of the invention, the wireless communications module 300 may be co-located and coexist in a communications apparatus (such as the mobile electronic device 100 shown in FIG. 1) with one or more wireless communications modules (such as the wireless communications module 101, Bluetooth module 102 and/or GPS module 103 shown in FIG. 1), and each wireless communications module may be arranged to provide different wireless communications services. Note that the oscillator 332 may also be disposed outside of the wireless communications module 300 and be shared by the wireless communications modules co-located and coexisting in the communications apparatus, and the invention should not be limited thereto. When there is more than one wireless communications modules co-located and coexisting in a communications apparatus, the clock signal CLK generated by the oscillator 332 may be sensitive to the changes inside of the communications apparatus. For example, an oscillating frequency of the clock signal CLK may drift when the environment temperature rises or drops. Specifically, should the oscillating frequency of the clock signal CLK drift, the oscillating frequency of the local oscillating signal LO accordingly would drift, causing an inaccurate RF frequency down conversion problem. Therefore, a method for compensating for the drift in oscillating frequency of the clock signal CLK is highly required.

According to an aspect of the invention, the processor 304 may detect a thermal change rate of an environment temperature inside of the communications apparatus comprising the wireless communications module 300 to obtain a detection result, and compensate for a frequency drift of the clock signal according to the detection result. According to another aspect of the invention, the processor 304 may also detect an ON/OFF status(es) of one or more wireless communications module(s), which are disposed adjacent to the wireless communications module 300 and/or co-located and coexisting in a communications apparatus, to obtain a detection result, and compensate for a frequency drift of the clock signal according to the detection result. The proposed detection and compensation methods are described in more detail in the following paragraphs.

According to an embodiment of the invention, the processor 304 may receive an enable signal from the one or more adjacent wireless communications module(s) indicating whether the corresponding adjacent wireless communications module is turned on or off, wherein at least one indication signal is generated to indicate the ON/OFF status of the corresponding adjacent wireless communications module according to the enable signal, and the frequency drift of the clock signal is compensated for according to the at least one indication signal. For example, the processor 304 may generate a first indication signal to indicate the moment when the adjacent wireless communications module is turned on or off according to the enable signal. The processor 304 may further maintain a timing counter and generate a second indication signal to indicate a time interval during which the adjacent wireless communications module is turned on according to the enable signal and a value of the timing counter. Note that in some embodiments of the invention, the processor 304 may also detect the activation/deactivation of a power amplifier utilized by the corresponding adjacent wireless communications module so as to obtain the ON/OFF status of thereof. In this manner, the enable signal may also be utilized to indicate, for example, the status of the power amplifier and the invention should not be limited thereto.

Figure 3:
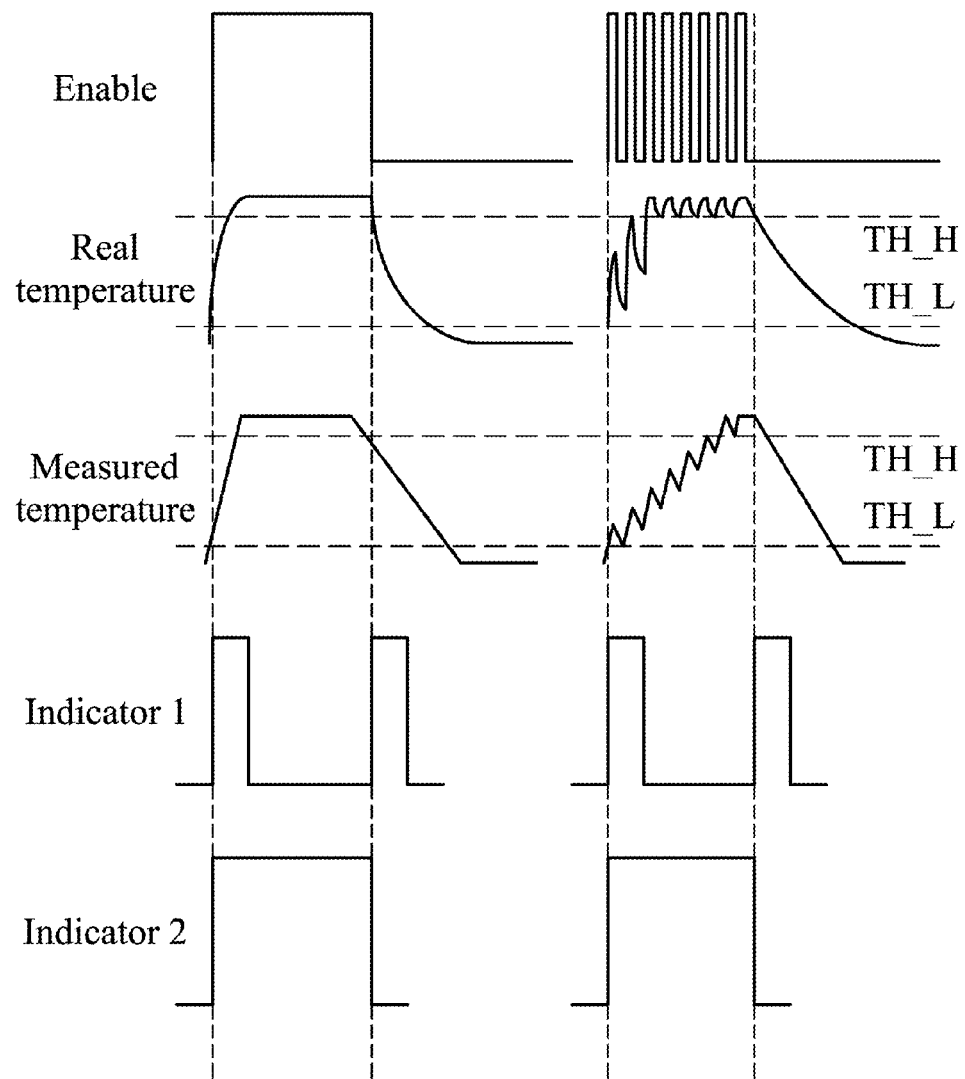
FIG. 3 is a timing diagram showing the waveforms of an enable signal, indication signals and the corresponding environment temperatures according to the invention of the invention.

FIG. 3 is a timing diagram showing the waveforms of an enable signal, indication signals and the corresponding environment temperatures according to the invention of the invention. When the adjacent wireless communications module is turned on, the enable signal Enable is pulled high to indicate the ON status thereof. The first indication signal Indicator 1 is therefore generated by the processor 304 to indicate the moment when the adjacent wireless communications module is turned on or off according to the enable signal Enable. For example, the first indication signal Indicator 1 may be pulled high for a predetermined time interval when detecting that the adjacent wireless communications module is turned on, and after that, the first indication signal Indicator 1 may be pulled high again for a predetermined time interval when detecting that the adjacent wireless communications module is turned off. The second indication signal Indicator 2 may also be generated by the processor 304 to indicate a time interval during which the adjacent wireless communications module is turned on according to the enable signal and a value of the timing counter. Note that the indication signals Indicator 1 and Indicator 2 are not only capable of being applied in the case when the adjacent wireless communications module is continuously turned on or off. For example, the indication signals Indicator 1 and Indicator 2 may also be utilized in the case when the adjacent wireless communications module is frequently turned on or off during a time period, such as the plurality of tense pulses shown in the right hand side of the enable signal Enable in FIG. 3, and the invention should not be limited thereto.

As shown in FIG. 3, the waveform of real temperature reveals that by turning on of the adjacent wireless communications module, the surrounding environment temperature accordingly rises. The rise in environment temperature is especially noticeable when the adjacent wireless communications module is just turned on. A rapid change in environment temperature may cause the oscillating frequency of the clock signal CLK to greatly drift. Therefore, according to some embodiments of the invention, the processor 304 may also detect the thermal change rate of the environment temperature, and generate the indication signals Indicator 1 or Indicator 2 according to the thermal change rate. The communication apparatus or the wireless communications module 300 may comprise a temperature meter 305 for measuring the environment temperature inside of the communication apparatus or the wireless communications module 300. Instead of receiving the enable signal Enable from the adjacent wireless communications module, the processor 304 may obtain the thermal change rate of the environment temperature according to a value of the timing counter and a measurement result of the temperature meter, such as the waveform of the Measured temperature as shown in FIG. 3, and generate the indication signals Indicator 1 or Indicator 2 according to the thermal change rate. For example, the indication signal Indicator 1 may be pulled high when the thermal change rate exceeds a predetermined threshold.

Note that according to still another aspect of the invention, the processor 304 may also define several threshold values, and generate the indication signals Indicator 1 or Indicator 2 according to the measurement result of the temperature meter and the threshold values. For example, the indication signal Indicator 1 may be pulled high for a predetermined time interval when the measured temperature exceeds the threshold value TH_L, so as to indicate the moment when the adjacent wireless communications module is turned on. After that, the indication signal Indicator 1 may be pulled high for a predetermined time interval again when the measured temperature drops below the threshold value TH_H, so as to indicate the moment when the adjacent wireless communications module is turned off. The indication signal Indicator 2 may also be pulled high when the measured temperature exceeds the threshold value TH_L and kept being high until the measured temperature drops below the threshold value TH_H, so as to indicate the time interval during which the adjacent wireless communications module is turned on. Note that the criteria of choosing the threshold values TH_L and TH_H and generating the indication signals Indicator 1 and 2 may be flexible designed according to different system requirements, and the invention should not be limited thereto.

Figure 4:
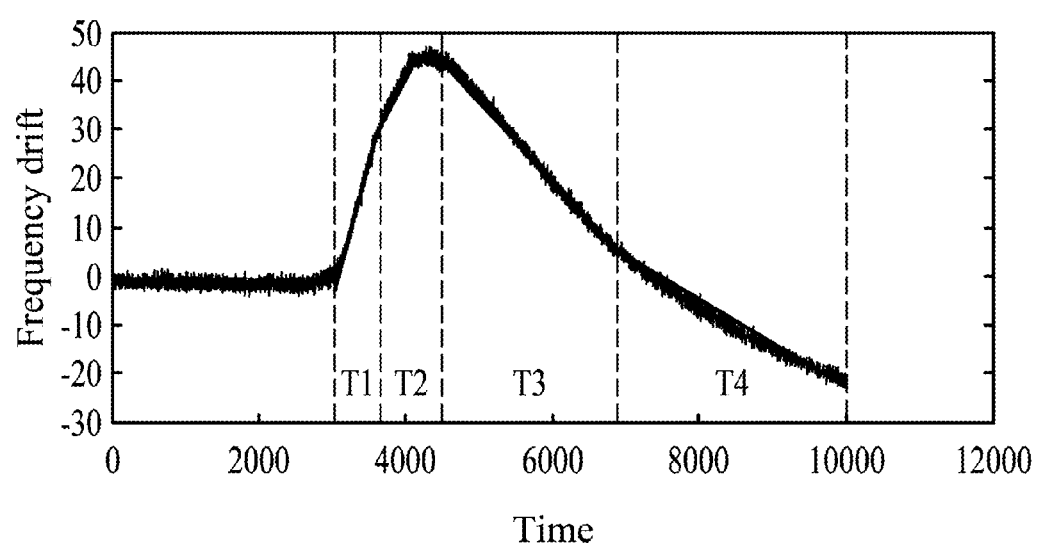
FIG. 4 shows a frequency drift model according to an embodiment of the invention.

FIG. 4 shows a frequency drift model in response to activation (i.e. turning on) of an adjacent wireless communications module according to an embodiment of the invention. In the time interval T1, the adjacent wireless communications module has just been turned on. As previously discussed, since the turning on of a wireless communications module may cause rapid change in environment temperature, the frequency drift grows enormously in the time interval T1. According to the embodiments of the invention, the processor 304 may compensate for the frequency drift of the clock signal by adjusting, in either the digital or analog domain, an oscillating frequency of an oscillating signal utilized by the signal processing module 302, or adjusting system parameters of the wireless communications module based on the frequency drift model as shown in FIG. 4. The proposed compensating methods are described in more detail in the following paragraphs.

Referring back to FIG. 2, according to an embodiment of the invention, the signal processing module 302 may comprise an intermediate frequency (IF) down converting unit 321, an IF wipe off unit 322 and a Doppler wipe off unit 323. The IF down converting unit 321 is arranged to perform frequency down conversion on the RF signals to generate IF signals according to the local oscillating signal LO. The IF wipe off unit 322 is arranged to perform frequency down conversion on the IF signals to generate the baseband signals according to an IF oscillating signal. The Doppler wipe off unit 323 is arranged to compensate for Doppler shift of the baseband signals according to a Doppler compensation signal. According to the embodiments of the invention, the processor 304 may compensate for the frequency drift of the clock signal by adjusting an oscillating frequency of the local oscillating signal LO, the IF oscillating signal or the Doppler compensation signal. For example, in some embodiments of the invention, the processor 304 may compensate for the frequency drift of the clock signal by adjusting an oscillating frequency of the local oscillating signal LO via adjusting a divisor of a frequency divider comprised in the PLL circuit according to the detection result and the frequency drift model as shown in FIG. 4.

Figure 5A:
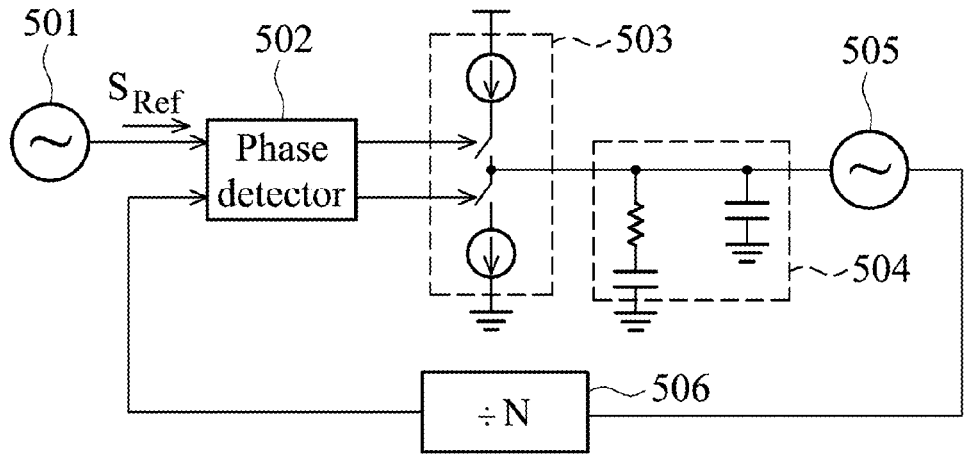
FIG. 5a shows a conventional integer N PLL frequency synthesizer.

FIG. 5a shows a conventional integer N PLL frequency synthesizer, which is used to generate a signal oscillated at a frequency as N, where N is a positive integer, times the frequency of the reference signal $S_{Ref}$ generated by the crystal oscillator 501. In the PLL 500, the phase detector 502 compares a phase difference between the reference signal $S_{Ref}$ and a feedback signal of the frequency divider 506, and generates an "up" or "down" control signal based on whether the feedback frequency is lagging or leading the reference frequency to the charge pump 503. The "up" or "down" control signals determine whether the Voltage Controlled Oscillator (VCO) 505 needs to operate at a higher or lower frequency, respectively.

Figure 5B:
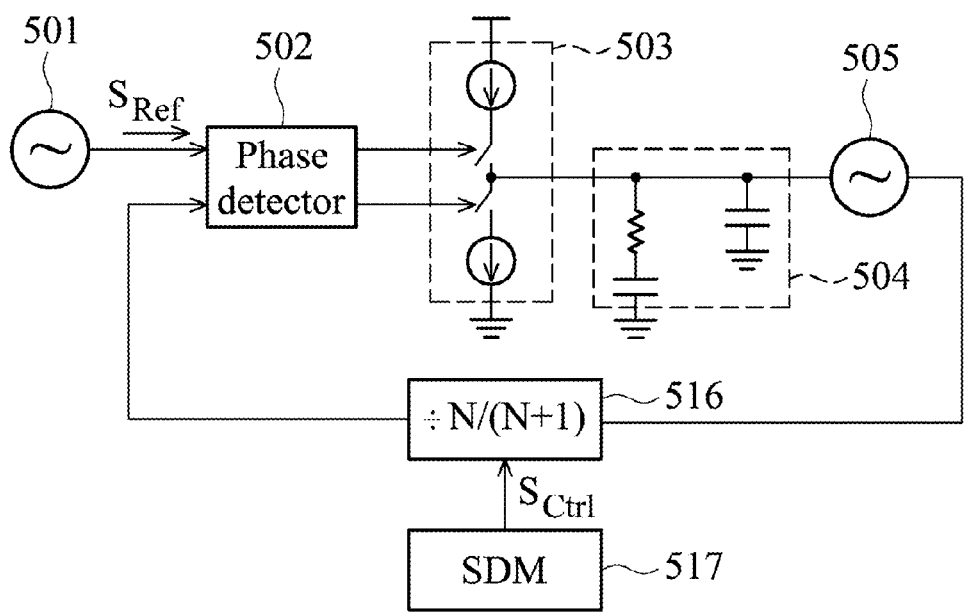
FIG. 5b shows a conventional fractional N PLL frequency synthesizer.

The charge pump 503 charges or discharges according to the comparison result so as to control the input voltage of the VCO 505. If the charge pump 503 receives an up signal, current is driven into the loop filter 504. Conversely, if it receives a down signal, current is drawn from the loop filter 504. The VCO 505 controls the oscillation frequency of the output signal according to the input voltage so as to generate the signal oscillated at a frequency as N times the frequency of the reference signal $S_{Ref}$. The output signal of the VCO 505 is further frequency divided by the frequency divider 506 and feedback to the phase detector 502. FIG. 5b shows a conventional fractional N PLL frequency synthesizer. The elements in PLL 510 and PLL 500 are almost the same, differing only in that the divisor of the frequency divider 516 can be selected as N or (N+1) according to the control signal $S_{Ctrl}$, where the control signal $S_{Ctrl}$ is generated by a sigma-delta modulator (SDM) 517. Frequency of the output signal of the VCO 505 is equivalent to an average of N and (N+1) times that of the reference signal.

According to the embodiments of the invention, for adjusting an oscillating frequency of the local oscillating signal LO, a divisor of the frequency divider 506 may be adjusted as shown in FIG. 5a when the PLL circuit 331 is an integer N PLL circuit, or when the PLL circuit 331 is a fractional N PLL circuit, the SDM 517 may be controlled to adequately adjust the control signal $S_{Ctrl}$ so as to adjust the equivalent divisor of the frequency divider 516, accordingly.

Figure 6A:
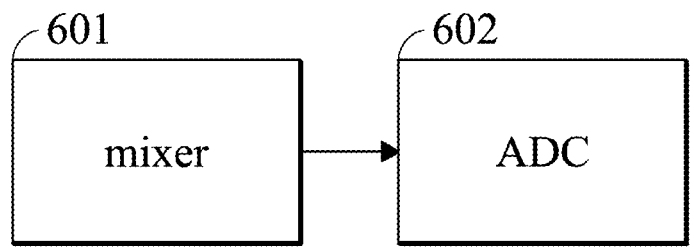
FIG. 6a shows a block diagram of an implementation of the IF wipe off unit according to an embodiment of the invention.
Figure 6B:
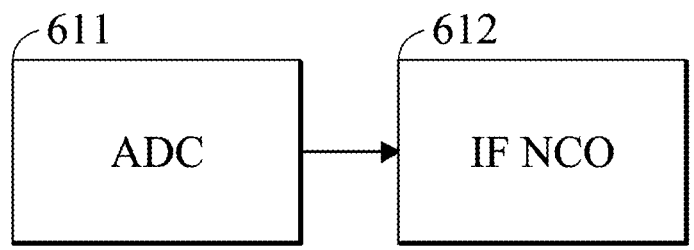
FIG. 6b shows a block diagram of another implementation of the IF wipe off unit according to another embodiment of the invention.

According to another embodiment of the invention, the processor 304 may compensate for the frequency drift of the clock signal by adjusting an oscillating frequency of the IF oscillating signal according to the detection result and the frequency drift model as shown in FIG. 4. FIG. 6a shows a block diagram of an implementation of the IF wipe off unit according to an embodiment of the invention, and FIG. 6b shows a block diagram of another implementation of the IF wipe off unit according to another embodiment of the invention. According to an embodiment of the invention, the IF wipe off unit 600 may comprise a mixer 601 for frequency down converting the IF signals to generate the baseband signals according to the IF oscillating signal and an analog to digital converter (ADC) 602 for performing analog to digital conversion on the baseband signals to generate a digital version of the baseband signals. In the embodiment, the processor 304 may compensate for the frequency drift of the clock signal by adjusting an oscillating frequency of the IF oscillating signal received by the mixer 601 according to the detection result and the frequency drift model. According to another embodiment of the invention, the IF wipe off unit 610 may comprise an ADC 611 for performing analog to digital conversion on the IF signals to generate digital IF signals and an IF numerically-controlled oscillator (NCO) for generating a digital signal having an IF oscillating frequency utilized for frequency down converting the digital IF signals. In the embodiment, the processor 304 may compensate for the frequency drift of the clock signal in the digital domain by controlling the NCO to adjust the IF oscillating frequency of the digital signal according to the detection result and the frequency drift model. Note that frequency down conversion of the digital IF signals may be done via digital signal processing.

Figure 7:
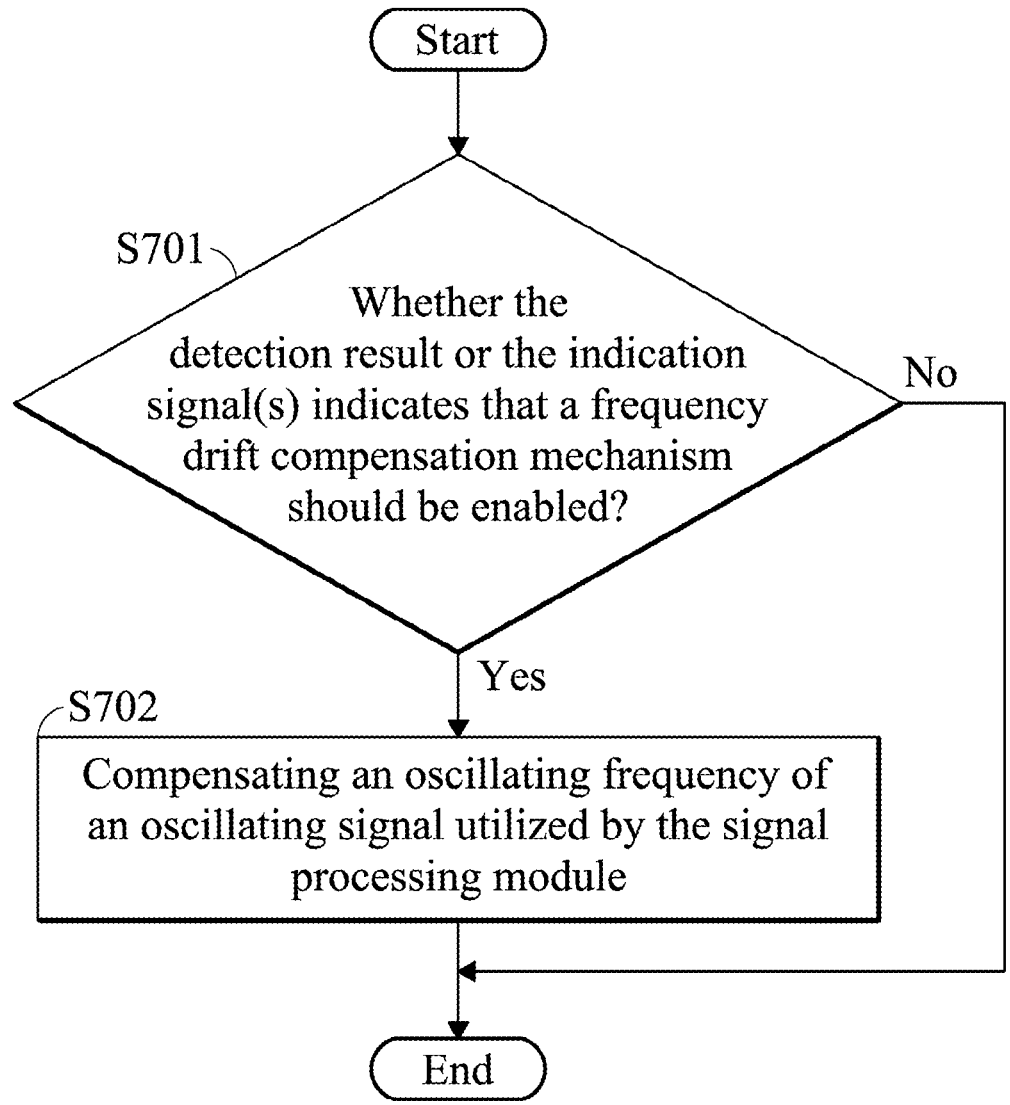
FIG. 7 shows a flow chart of a method for determining whether to adjust an oscillating frequency of an oscillating signal utilized by the signal processing module to compensate for the frequency drift of the clock signal according to an embodiment of the invention.

According to yet another embodiment of the invention, the processor 304 may compensate for the frequency drift of the clock signal in the digital domain by controlling the Doppler wipe off unit 323 to adjust an oscillating frequency of the Doppler compensation signal according to the detection result and the frequency drift model as shown in FIG. 4. FIG. 7 shows a flow chart of a method for determining whether to adjust an oscillating frequency of an oscillating signal utilized by the signal processing module 302 to compensate for the frequency drift of the clock signal according to an embodiment of the invention. In the embodiment, the processor 304 may first determine whether the detection result or the indication signal(s), such as Indicator 1 and/or Indicator 2 shown in FIG. 3, indicates that a frequency drift compensation mechanism should be enabled (Step S701). As previously described, the frequency drift compensation mechanism should be enabled when, for example, the thermal change rate exceeds a predetermined threshold, or the indication signal(s) Indicator 1 and/or Indicator 2 indicates that an adjacent wireless communications module (or an power amplifier of the adjacent wireless communications module) is turned on. When the processor 304 determines that a frequency drift compensation mechanism should be enabled, the processor 304 may compensate an oscillating frequency of an oscillating signal utilized by the signal processing module as described above (Step S702).

Figure 8:
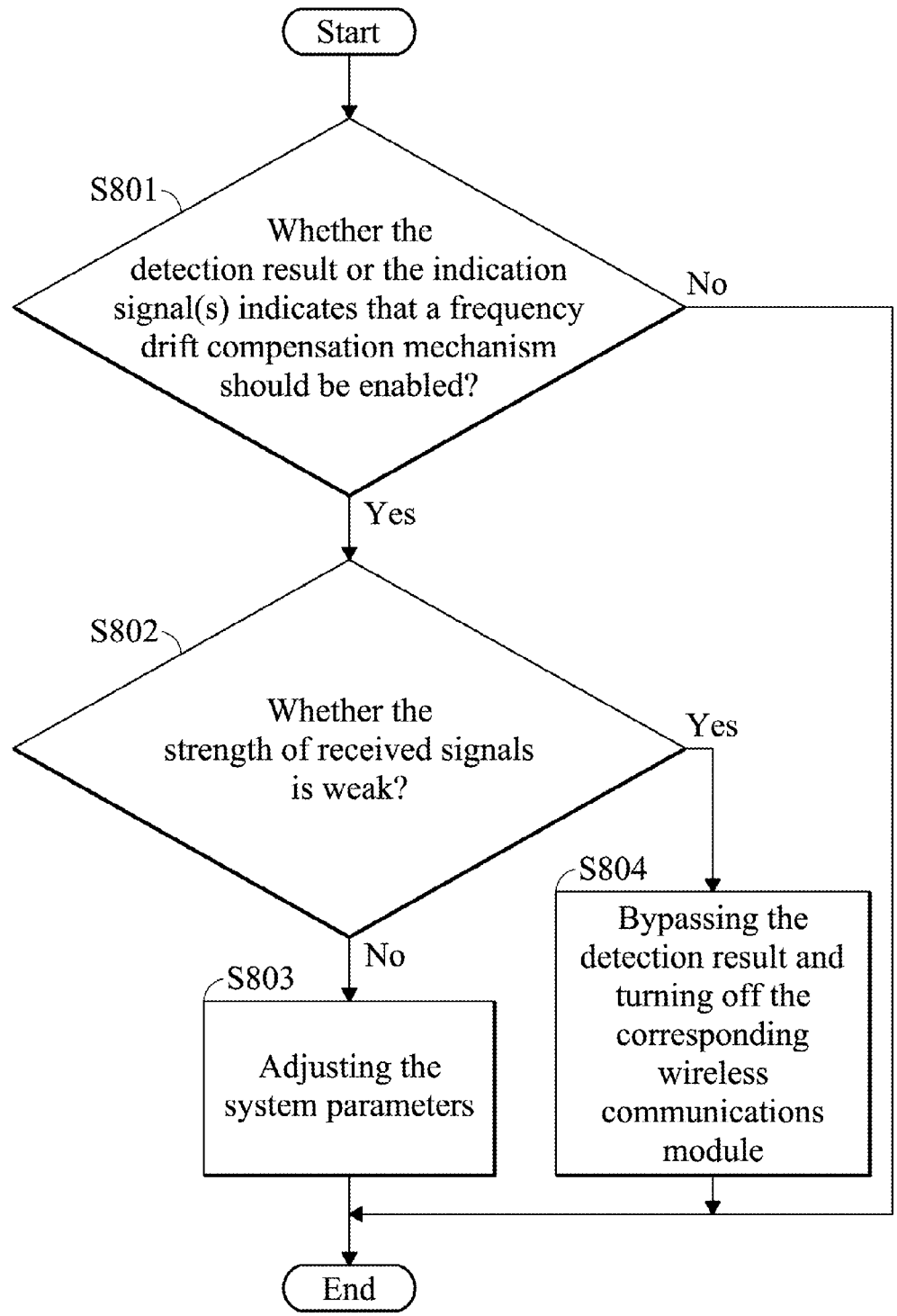
FIG. 8 shows a flow chart of a method for determining whether to adjust a system parameter to compensate for the frequency drift of the clock signal according to another embodiment of the invention.

According to another aspect of the invention, as mentioned above, the processor 304 may also compensate for the frequency drift of the clock signal by adjusting system parameters of the wireless communications module based on the detection result and the frequency drift model as shown in FIG. 4. In the embodiment, the processor 304 may compensate for the frequency drift of the clock signal by adjusting a bandwidth of a loop filter comprised in the PLL circuit, such as the loop filter 504 shown in FIGS. 5a and 5b, according to the detection result and the frequency drift model. For example, the processor 304 may increase the bandwidth of the loop filter so as to fast relock the frequency of the clock signal when, for example, the thermal change rate exceeds a predetermined threshold, or the indication signal(s) Indicator 1 and/or Indicator 2 indicates that an adjacent wireless communications module is turned on (or an power amplifier of the adjacent wireless communications module is turned on). Alternatively, the processor 304 may also determine to discard the detection result and directly turn off the wireless communications module 300 when needed. For example, when the strength of the received RF signal is weak, the processor 304 may determine to directly shut down the wireless communications module 300. FIG. 8 shows a flow chart of a method for determining whether to adjust a system parameter to compensate for the frequency drift of the clock signal according to another embodiment of the invention. In the embodiment, the processor 304 may first determine whether the detection result or the indication signal(s), such as Indicator 1 and/or Indicator 2 shown in FIG. 3, indicates that a frequency drift compensation mechanism should be enabled (Step S801). As previously described, the frequency drift compensation mechanism should be enabled when, for example, the thermal change rate exceeds a predetermined threshold, or the indication signal(s) Indicator 1 and/or Indicator 2 indicates that an adjacent wireless communications module is turned on (or an power amplifier of the adjacent wireless communications module is turned on). When the processor 304 determines that a frequency drift compensation mechanism should be enabled, the processor 304 may further determine whether the strength of received signals is weak (Step S802). When the strength of received signals is still strong enough, the processor 304 may adjust the system parameters (Step S803), such as increase the bandwidth of the loop filter so as to fast relock the frequency of the clock signal. Otherwise, the processor 304 may determine to directly bypass the detection result and turn off the corresponding wireless communications module (Step S804).

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:
1. A communications apparatus, comprising:
 a first wireless communications module, arranged to provide a first wireless communications service and comprising:
  a receiving unit, arranged to receive RF signals from an air interface;

a signal processing module, arranged to perform frequency down conversion on the RF signals to generate baseband signals according to a clock signal; and a processor, arranged to process the baseband signals;

a second wireless communications module, arranged to provide a second wireless communications service; and a clock generating unit, comprising an oscillator for generating the clock signal and a phase-locked loop (PLL) circuit for generating a local oscillating signal according to the clock signal;

wherein the processor further detects an ON/OFF status of the second wireless communications module to obtain a detection result, and compensates for frequency drift of the clock signal according to the detection result;

wherein the detection result is determined according to an enable signal generated from the second wireless communications module to the processor to indicate the ON/OFF status of the second wireless communications module; and wherein the processor compensates for the frequency drift of the clock signal by adjusting an oscillating frequency of the local oscillating signal via adjusting a divisor of a frequency divider comprised in the PLL circuit according to the detection result or the processor compensates for the frequency drift of the clock signal by adjusting a bandwidth of a loop filter comprised in the PLL circuit according to the detection result.

2. The communication apparatus as claimed in claim 1, wherein the first wireless communications module further comprises a timing counter, the processor generates a first indication signal to indicate the moment when the second wireless communications module is turned on or off according to the enable signal, and a second indication signal to indicate a time interval during which the second wireless communications module is turned on according to the enable signal and a value of the timing counter.

3. The communication apparatus as claimed in claim 1, further comprising a timing counter and a temperature meter for measuring an environment temperature inside of the communication apparatus, wherein the processor further obtains a thermal change rate of the environment temperature according to a value of the timing counter and a measurement result of the temperature meter, and compensates for frequency drift of the clock signal according to the thermal change rate.

4. The communication apparatus as claimed in claim 3, wherein the processor further generates a first indication signal to indicate the moment when the second wireless communications module is turned on or off and a second indication signal to indicate the time interval during which the second wireless communications module is turned on according to the thermal change rate.

5. The communication apparatus as claimed in claim 1, wherein the signal processing module comprises:

an intermediate frequency (IF) down converting unit, arranged to perform frequency down conversion on the RF signals to generate IF signals according to the local oscillating signal; and an IF wipe off unit, arranged to perform frequency down conversion on the IF signals to generate the baseband signals.

6. The communication apparatus as claimed in claim 5, wherein the IF wipe off unit comprises:

an analog to digital converter, arranged to perform analog to digital conversion on the IF signals to generate digital IF signals; and a numerically-controlled oscillator (NCO), arranged to generate a digital signal having an IF oscillating frequency utilized for frequency down converting the digital IF signals, wherein the processor compensates for the frequency drift of the clock signal in a digital domain by controlling the NCO to adjust the IF oscillating frequency of the digital signal according to the detection result.

7. The communication apparatus as claimed in claim 5, wherein the signal processing module further comprises:

a Doppler wipe off unit, arranged to compensate for Doppler shift of the baseband signals according to a Doppler compensation signal, wherein the processor compensates for the frequency drift of the clock signal in a digital domain by controlling the Doppler wipe off unit to adjust an oscillating frequency of the Doppler compensation signal according to the detection result.

8. A wireless communications module, arranged to provide a first wireless communications service, comprising:

a receiving unit, arranged to receive RF signals from an air interface;

a signal processing module, arranged to perform frequency down conversion on the RF signals to generate baseband signals according to a clock signal;

a processor, arranged to process the baseband signals; and a clock generating unit, comprising an oscillator for generating the clock signal and a phase-locked loop (PLL) circuit for generating a local oscillating signal according to the clock signal, wherein the processor further detects a thermal change rate of an environment temperature according to an ON/OFF status of an adjacent wireless communications module to obtain a detection result, and compensates for frequency drift of the clock signal according to the detection result, and wherein the ON/OFF status is detected according to an enable signal generated from the adjacent wireless communications module to the processor, and wherein the processor compensates for the frequency drift of the clock signal by adjusting an oscillating frequency of the local oscillating signal via adjusting a divisor of a frequency divider comprised in the PLL circuit according to the detection result or the processor compensates for the frequency drift of the clock signal by adjusting a bandwidth of a loop filter comprised in the PLL circuit according to the detection result.

9. The wireless communications module as claimed in claim 8, further comprising a timing counter; and a temperature meter for measuring the environment temperature, wherein the processor detects the thermal change rate according to a value of the timing counter and a measurement result of the temperature meter.

10. The wireless communications module as claimed in claim 8, wherein the signal processing module comprises:

an intermediate frequency (IF) down converting unit, arranged to perform frequency down conversion on the RF signals to generate IF signals according to the local oscillating signal; and an IF wipe off unit, arranged to perform frequency down conversion on the IF signals to generate the baseband signals.

11. The wireless communications module as claimed in claim 10, wherein the IF wipe off unit comprises:

an analog to digital converter, arranged to perform analog to digital conversion on the IF signals to generate digital IF signals; and a numerically-controlled oscillator (NCO), arranged to generate a digital signal having an IF oscillating frequency utilized for frequency down converting the digital IF signals, wherein the processor compensates for the frequency drift of the clock signal in a digital domain by controlling the NCO to adjust the IF oscillating frequency of the digital signal according to the detection result.

12. The wireless communications module as claimed in claim 10, wherein the signal processing module further comprises:

a Doppler wipe off unit, arranged to compensate for Doppler shift of the baseband signals according to a Doppler compensation signal, wherein the processor compensates for the frequency drift of the clock signal in a digital domain by controlling the Doppler wipe off unit to adjust an oscillating frequency of the Doppler compensation signal according to the detection result.

* * * * *